United States Patent
Oh et al.

(10) Patent No.: US 12,190,832 B2
(45) Date of Patent: Jan. 7, 2025

(54) TILED DISPLAY DEVICE

(71) Applicant: Samsung Display Co., Ltd., Yongin-si (KR)

(72) Inventors: Ho Kil Oh, Yongin-si (KR); Jin Suek Kim, Yongin-si (KR); Sae Ron Park, Yongin-si (KR); Seung Bo Shim, Yongin-si (KR); Eung Gyu Lee, Yongin-si (KR); Jae Soo Jang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 779 days.

(21) Appl. No.: 17/443,575

(22) Filed: Jul. 27, 2021

(65) Prior Publication Data

US 2022/0059611 A1 Feb. 24, 2022

(30) Foreign Application Priority Data

Aug. 19, 2020 (KR) ........................ 10-2020-0104209

(51) Int. Cl.
| | |
|---|---|
| *G09G 3/34* | (2006.01) |
| *H01L 33/50* | (2010.01) |
| *G09F 9/30* | (2006.01) |
| *G09F 9/33* | (2006.01) |
| *G09G 3/30* | (2006.01) |
| *G09G 3/32* | (2016.01) |
| *G09G 3/3208* | (2016.01) |
| *H01L 25/075* | (2006.01) |

(Continued)

(52) U.S. Cl.
CPC .......... *G09G 3/3426* (2013.01); *H01L 33/50* (2013.01); *G09F 9/301* (2013.01); *G09F 9/33* (2013.01); *G09G 3/30* (2013.01); *G09G 3/32* (2013.01); *G09G 3/3208* (2013.01); *G09G 2300/026* (2013.01); *G09G 2300/0413* (2013.01); *G09G 2300/0426* (2013.01); *H01L 25/0753* (2013.01); *H01L 25/0756* (2013.01); *H01L 33/44* (2013.01); *H10K 59/18* (2023.02)

(58) Field of Classification Search
CPC .......... G09G 3/3426; G09G 3/32; G09G 3/30; G09G 3/3208; G09G 2300/026; G09G 2300/0413; G09G 2300/0426; H01L 25/0756; H01L 25/0753; H01L 33/44; H01L 33/50; H10K 59/18; G09F 9/301; G09F 9/33
See application file for complete search history.

(56) References Cited

U.S. PATENT DOCUMENTS

| | | | |
|---|---|---|---|
| 10,714,451 B2 | 7/2020 | Lee et al. | |
| 2007/0001927 A1* | 1/2007 | Ricks | ................. G09F 9/3026 345/1.1 |

(Continued)

FOREIGN PATENT DOCUMENTS

KR 10-2019-0062787 A 6/2019

*Primary Examiner* — William Boddie
*Assistant Examiner* — Saifeldin E Elnafia
(74) *Attorney, Agent, or Firm* — Lewis Roca Rothgerber Christie LLP

(57) ABSTRACT

A tiled display device includes a first display device including a first pixel, and a second display device coupled to the first display device in a bonding area, including a second pixel, and overlapping the first display device in the bonding area in a plane view.

14 Claims, 11 Drawing Sheets

(51) Int. Cl.
  *H01L 33/44* (2010.01)
  *H10K 59/18* (2023.01)

(56) References Cited

U.S. PATENT DOCUMENTS

2016/0155391 A1\* 6/2016 Takesue ............... G09G 3/3208
                                                                 345/690
2017/0069664 A1\* 3/2017 Nakamura ............. H10K 59/18

\* cited by examiner

TILED DISPLAY DEVICE

CROSS-REFERENCE TO RELATED APPLICATION

This application claims priority to, and the benefit of, Korean patent application 10-2020-0104209 filed on Aug. 19, 2020 in the Korean Intellectual Property Office, the entire disclosure of which is incorporated herein by reference.

BACKGROUND

1. Field

The present disclosure generally relates to a tiled display device.

2. Description of Related Art

A display device may display an image by using, as a light source of a pixel, a light emitting element such as a light emitting diode. The light emitting diode exhibits relatively satisfactory durability even in poor environmental conditions, and has excellent performance in terms of lifespan and luminance. Research for manufacturing a light emitting diode by using a material having an inorganic crystal structure with high reliability, and utilizing the light emitting diode as a light source by disposing the light emitting diode in a display panel of a display device has been conducted.

Meanwhile, in the case of a tiled display device including a plurality of display panels, a non-display area (or bezel area) between the display panels is viewed by a user. Therefore, the display panels may be recognized as screens separated from each other, and immersion of the user may be interrupted. Accordingly, a display panel and a display device, which have a reduced or minimized non-display area, are required.

SUMMARY

Embodiments provide a tiled display device in which a non-display area located between a plurality of display panels constituting the tiled display device is reduced or minimized, so that external visibility can be reduced or minimized.

In accordance with an aspect of the present disclosure, there is provided a tiled display device including a first display device including a first pixel, and a second display device coupled to the first display device in a bonding area, including a second pixel, and overlapping the first display device in the bonding area in a plane view.

At least a portion of the second display device may be under a bottom of the first display device with respect to a thickness direction of the second display device.

The first display device may include a first outer area in the bonding area, wherein the second display device includes a second outer area in the bonding area.

The first outer area and the second outer area might not overlap with each other in a plane view.

The first outer area may be configured to emit light therein without the first pixel being in the first outer area.

The second display device may further include a dummy pixel area in which a light emitting element is located, the light emitting element being in the bonding area and being configured to output light.

The dummy pixel area may overlap with the first outer area in a plane view.

At least a portion of the first pixel may overlap with the second outer area in a plane view, wherein the second outer area is configured to provide light therefrom.

The first outer area may be configured to transmit light output from a dummy pixel in the dummy pixel area such that light is emitted to the outside.

The first display device may include a first light control part configured to convert a wavelength of provided light, wherein the second display device includes a second light control part configured to convert a wavelength of provided light.

At least a portion of the first light control part may be in the first outer area, wherein at least a portion of the second light control part is in the dummy pixel area.

The second light control part may be not located in the second outer area.

The first light control part in the first outer area may be configured to convert light into white light.

The first light control part in the first outer area may include a first wavelength conversion material and a second wavelength conversion material, wherein the first wavelength conversion material is configured to convert light of a first color into light of a second color, and wherein the second wavelength conversion material is configured to convert the light of the first color into light of a third color.

The second display device may be configured to output blue light in the dummy pixel area.

First light having a first wavelength may be output from the dummy pixel area, wherein at least a portion of the first light is transmitted through the first outer area of the first display device such that the first light is converted into second light having a second wavelength that is different from the first wavelength.

The second display device may be configured to output light of a first color in the dummy pixel area, and to output the light of the first color in a pixel area adjacent to the dummy pixel area.

The second display device may be configured to output light with a first luminance in the dummy pixel area, and to output light with a second luminance in a pixel area most adjacent to the dummy pixel area, the first luminance and the second luminance being the same.

The first display device may include a first bending area in which at least a portion of the first display device is bent, wherein the second display device includes a second bending area in which at least a portion of the second display device is bent, and wherein the first bending area and the second bending area overlap with each other in the bonding area.

The first display device may include a first substrate, wherein the second display device includes a second substrate, wherein the first substrate includes a (1-1)th substrate area having a (1-1)th thickness, and a (1-2)th substrate area having a (1-2)th thickness that is thinner than the (1-1)th thickness, wherein the second substrate includes a (2-1)th substrate area having a (2-1)th thickness, and a (2-2)th substrate area having a (2-2)th thickness that is thinner than the (2-1)th thickness, and wherein the (1-2)th substrate area and the (2-2)th substrate area overlap with each other in the bonding area in a plane view.

BRIEF DESCRIPTION OF THE DRAWINGS

Embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
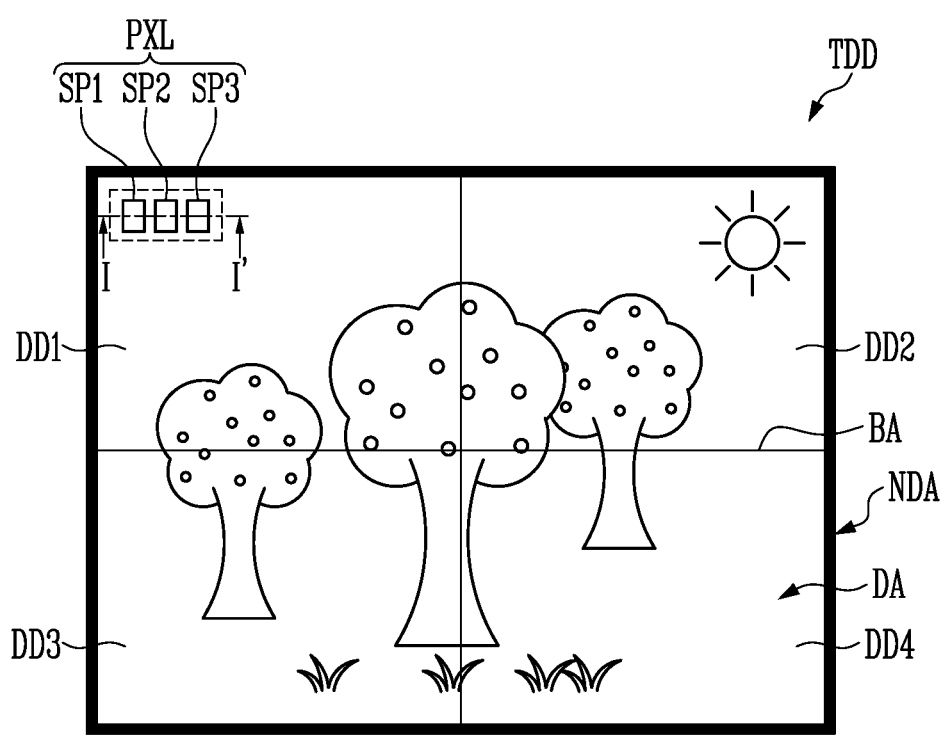
FIG. 1 is a plan view illustrating a tiled display device in accordance with some embodiments of the present disclosure.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof.

Similarly, the expression such as "at least one of A and B" may include A, B, or A and B. As used herein, the term "and/or" includes any and all combinations of one or more of the associated listed items. For example, the expression such as "A and/or B" may include A, B, or A and B.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

The present disclosure generally relates to a tiled display device.

Hereinafter, a tiled display device in accordance with some embodiments of the present disclosure will be described with reference to FIGS. 1 to 11.

FIG. 1 is a plan view illustrating a tiled display device in accordance with some embodiments of the present disclosure.

The tiled display device TDD may provide visual data to a user. The tiled display device TDD may output light that generally travels along a third direction DR3.

The tiled display device TDD may be implemented by bonding a plurality of display devices DD. The tiled display device TDD may display a large screen by bonding the plurality of display devices DD. Accordingly, the tiled display device TDD can be applied to a field in which a wide display surface is suitable, such as an outdoor billboard.

The plurality of display devices DD included in the tiled display device TDD may include first to fourth display devices DD1 to DD4. In some embodiments, the tiled display device TDD may include four display devices, but a number of display devices constituting the tiled display device TDD is not limited to any specific example.

The tiled display device TDD may include a pixel PXL, a display area DA, a non-display area NDA, and a bonding area BA.

Light may be output in the display area DA. The pixel PXL may be located in the display area DA. The display area DA may be formed on one surface of the tiled display device TDD. However, the present disclosure is not limited thereto, and the display area DA may be formed even on a side surface and/or a rear surface of the tiled display device TDD.

The pixel PXL may include a first sub-pixel SP1, a second sub-pixel SP2, and a third sub-pixel SP3. The first to third sub-pixels SP1 to SP3 may output lights of different colors. In some embodiments, light of a first color may be output from the first sub-pixel SP1, light of a second color may be output from the second sub-pixel SP2, and light of a third color may be output from the third sub-pixel SP3.

Figure 3:
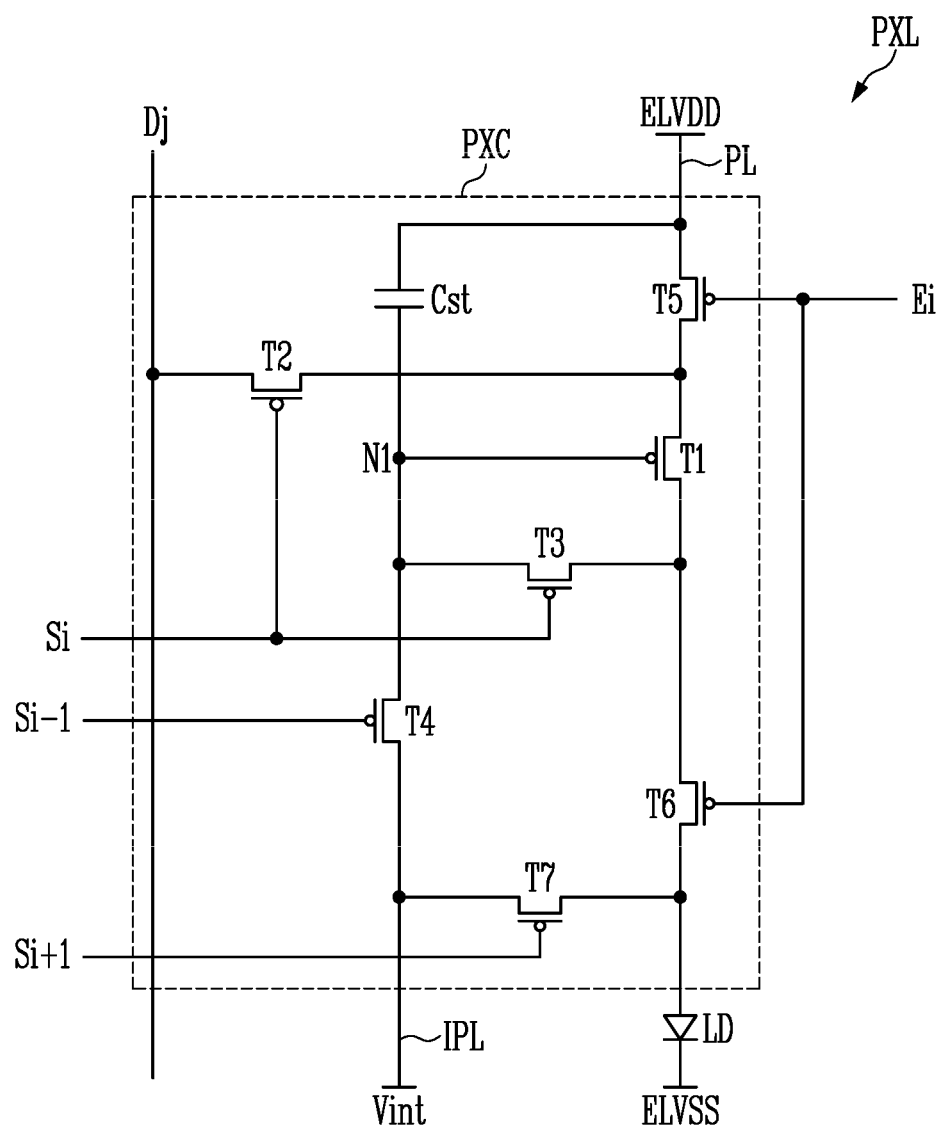
FIG. 3 is a view illustrating a pixel driving circuit of a pixel included in the tiled display device in accordance with some embodiments of the present disclosure.

Each of the first to third sub-pixels SP1 to SP3 may include a light emitting element (e.g., light emitting LD shown in FIG. 3). The light emitting element LD may provide light when electrical information or signals are provided.

No light is output in the non-display area NDA. The non-display area NDA is an area excluding the display area DA and the bonding area, and the pixel PXL may be omitted from the non-display area NDA.

The bonding area BA may mean an area between the plurality of display devices DD included in the tiled display device TDD. For example, at least a portion of the bonding area BA may be located between the first display device DD1 and the second display device DD2.

The plurality of display devices DD may overlap with each other in the bonding area BA. For example, at least a portion of each of the first display device DD1 and the second display device DD2 may overlap with each other in the bonding area BA, in a plane view. For example, at least a portion of the second display device DD2 may be located on the bottom of, or below, the first display device DD1 with respect to a thickness direction of the second display device DD2. The thickness direction may mean the third direction DR3.

In the bonding area BA, the pixel PXL may be located to output light. The pixel PXL may be located in at least one of display devices overlapping with each other in the bonding area BA.

The bonding area BA will be described in detail later with reference to FIGS. 7 to 11, and therefore, overlapping descriptions will be omitted.

Figure 2:
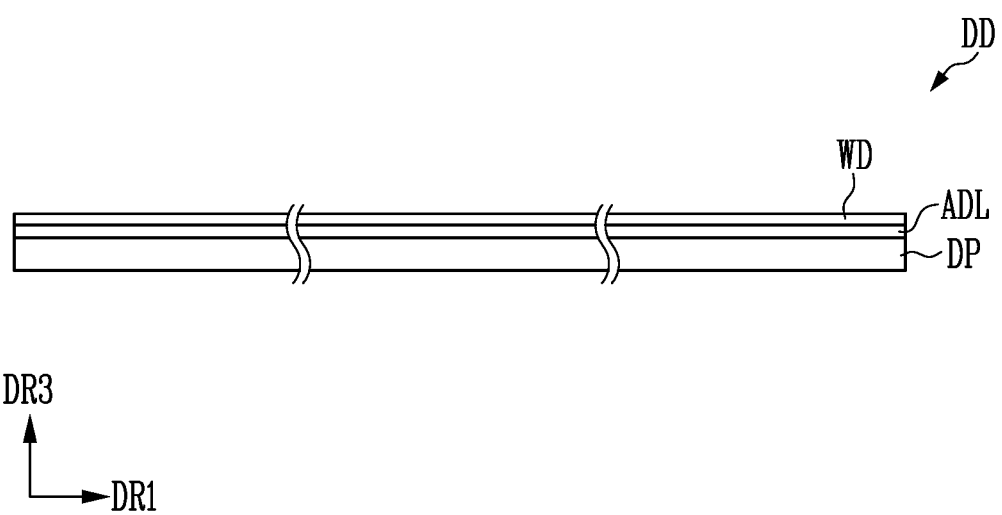
FIG. 2 is a sectional view illustrating a display device included in the tiled display device in accordance with some embodiments of the present disclosure.

FIG. 2 is a sectional view illustrating a display device included in the tiled display device in accordance with some embodiments of the present disclosure.

Referring to FIG. 2, the display device DD may include a display panel DP, an adhesive member ADL, and a window WD.

The display panel DP may include a pixel PXL for providing light. The display panel DP may be implemented in various forms. For example, the display panel DP may be a self-luminescent display panel, such as an Organic Light Emitting Display panel (OLED panel) using an organic light emitting diode as a light emitting element, a Nano-scale LED Display panel (Nano LED panel) using a nano-scale light emitting diode as a light emitting element, a Quantum Dot Organic Light Emitting Display panel (QD OLED panel) using an organic light emitting diode and a quantum dot, or a Quantum Dot Nano-scale LED Display panel (QD Nano LED panel) using a nano-scale light emitting diode and a quantum dot. Alternatively, the display panel DP may be a non-self-luminescent display panel, such as a Liquid Crystal Display panel (LCD panel), an Electro-Phoretic Display panel (EPD panel), or an Electro-Wetting Display panel (EWD panel).

The window WD may be located on the display panel DP. The window WD and the display panel DP may be attached to each other by the adhesive member ADL. In some embodiments, the adhesive member ADL may include a resin, an optically clear adhesive, and a pressure sensitive adhesive, but the present disclosure is not limited thereto. In some embodiments, the window WD may be integrally formed with the display panel DP. The window WD and the display panel DP may be manufactured in a single process.

The window WD may protect the display panel DP. The window WD may protect the display panel DP from an external impact, and may provide an input surface and/or a display surface to a user. The window WD may include various materials including glass or plastic, and may be configured in a single layer or a multi-layer.

Hereinafter, the display panel DP will be described with reference to FIGS. 3 to 6.

Figure 4:
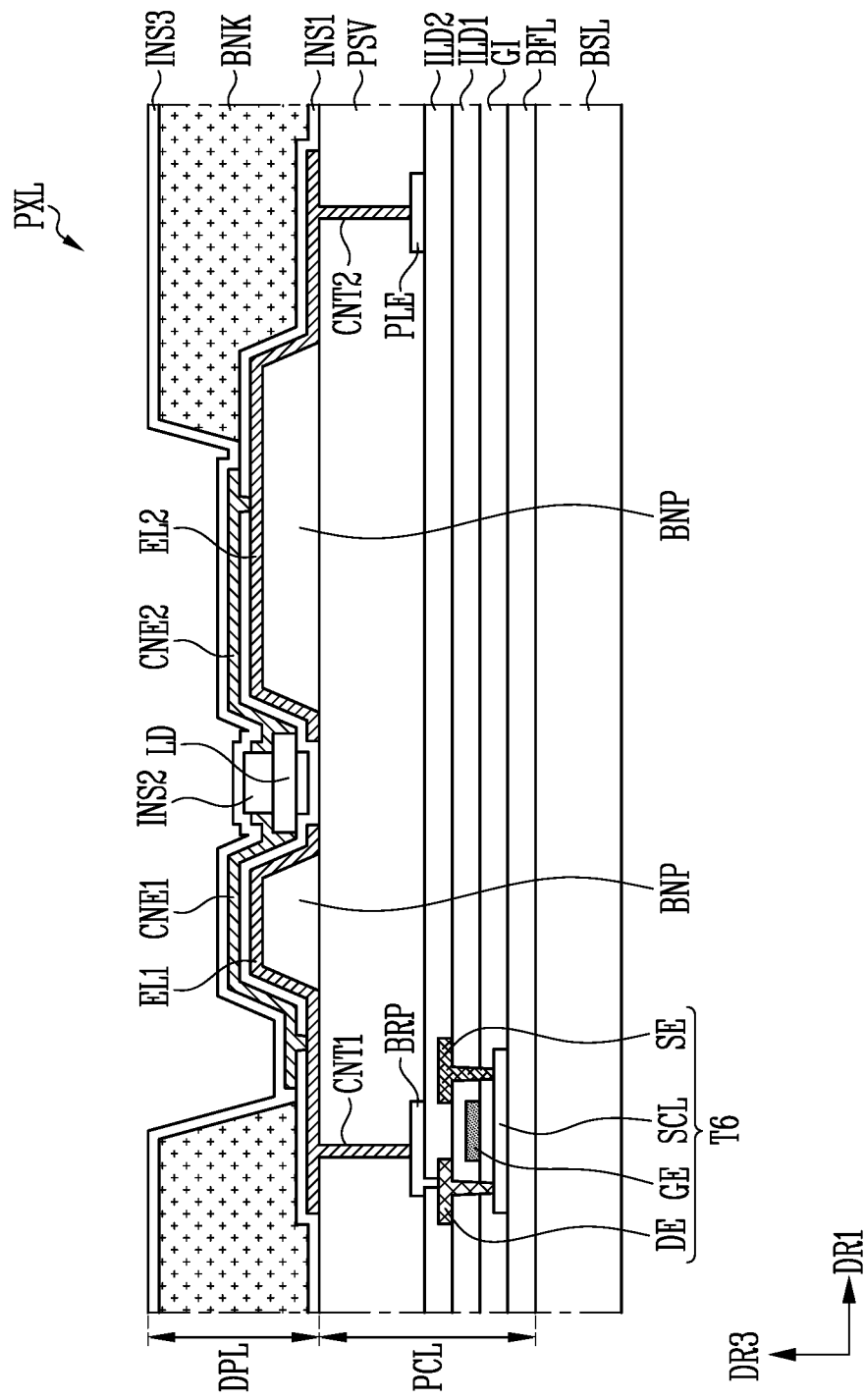
FIG. 4 is a sectional view illustrating a pixel included in the tiled display device in accordance with some embodiments of the present disclosure.

As described above, the display panel DP may include a pixel PXL. FIGS. 3 and 4 are views illustrating the pixel PXL included in the display panel DP. FIG. 3 is a view illustrating a pixel driving circuit of the pixel included in the tiled display device in accordance with some embodiments of the present disclosure.

Referring to FIG. 3, the pixel PXL included in the display panel DP in accordance with some embodiments of the present disclosure may include a pixel driving circuit PXC.

The pixel driving circuit PXC may include first to seventh transistors T1 to T7 and a storage capacitor Cst. The pixel driving circuit PXC may be electrically connected to a light emitting element LD.

A first electrode of the first transistor T1 may be connected to a first power source ELVDD via the fifth transistor T5, and a second electrode of the first transistor T1 may be connected to an anode electrode of the light emitting element LD via the sixth transistor T6. The first transistor T1 may control current data flowing from the first power source ELVDD to a second power source ELVSS via the light emitting element LD, based on information on a voltage of the first node N1. The first transistor T1 may be a driving transistor.

The second transistor T2 may be connected between the first electrode of the first transistor T1 and a jth data line Dj. A gate electrode of the second transistor T2 may be connected to an ith scan line Si. The second transistor T2 may be turned on when a scan signal is applied from the ith scan line Si, thereby electrically connecting the jth data line Dj and the first electrode of the first transistor T1. The second transistor T2 may be a switching transistor.

The third transistor T3 may be connected between the second electrode of the first transistor T1 and the first node N1. The third transistor T3 may be turned on when the scan signal having a gate-on voltage is applied from the ith scan line Si, to electrically connect the second electrode of the first transistor T1 and the first node N1.

The fourth transistor T may be connected between the first node N1 and an initialization power line IPL to which an initialization power source Vint is applied. A gate electrode of the fourth transistor T4 may be connected to an (i−1)th scan line Si−1. The fourth transistor T4 may be turned on when the scan signal is applied to the (i−1)th scan line Si−1 to thereby supply a voltage of the initialization power source Vint to the first node N1. The fourth transistor T4 may be an initialization transistor.

The fifth transistor T5 may be connected between a power line to which the first power source ELVDD is applied and the first transistor T1. A gate electrode of the fifth transistor T5 may be connected to an ith emission control line Ei. The fifth transistor T5 may be turned off when an emission control signal having a gate-off voltage (e.g., a high level voltage) is applied from the ith emission control line Ei, and may be turned on in other cases.

The sixth transistor T6 may be connected between the first transistor T1 and the light emitting element LD. A gate electrode of the sixth transistor T6 may be connected to the ith emission control line Ei. The sixth transistor T6 may be turned off when the emission control signal having the gate-off voltage is applied from the ith emission control line Ei, and may be turned on in other cases.

The seventh transistor T7 may be connected between the initialization power line IPL and the anode electrode of the light emitting element LD. A gate electrode of the seventh transistor T7 may be connected to an (i+1)th scan line Si+1. The seventh transistor T7 may be turned on when the scan signal having the gate-on voltage (e.g., a low level voltage) is applied from the (i+1)th scan line Si+1 to thereby supply the voltage of the initialization power source Vint to the anode electrode of the light emitting element LD. Although a case where the gate electrode of the seventh transistor T7 is connected to the (i+1)th scan line Si+1 has been illustrated in FIG. 3, the present disclosure is not limited thereto. In some embodiments, the gate electrode of the seventh transistor T7 may be connected to the ith scan line Si. The seventh transistor T7 may be turned on by the scan signal having the gate-on voltage, which is applied from the ith scan line Si.

The voltage of the initialization power source Vint may be set as a voltage that is lower than that of a data signal. For example, the voltage of the initialization power source Vint may be set equal to, or lower than, a lowest voltage of the data signal.

The storage capacitor Cst may be connected between the power line PL to which the first power source ELVDD is applied and the first node N1. The storage capacitor Cst may store information on a voltage corresponding to the data signal and a threshold voltage of the first transistor T1.

The anode electrode of the light emitting element LD may be connected to the first transistor T1 via the sixth transistor T6. A cathode electrode of the light emitting element LD may be connected to the second power source ELVSS.

The light emitting element LD may emit light (e.g., light with a predetermined luminance) corresponding to an amount of current supplied from the first transistor T1. A voltage value of the first power source ELVDD may be set higher than that of the second power source ELVSS such that a current can flow through the light emitting element LD.

In FIG. 3, it is illustrated that the pixel PXL includes a single light emitting element LD. However, in other embodiments, the pixel PXL may include a plurality of light emitting elements LD, and the plurality of light emitting elements LD may be connected in series, parallel, or series/parallel to each other.

Additionally, although a case where the pixel PXL is driven by using a signal from the ith scan line Si, the (i−1)th scan line Si−1, and the (i+1)th scan line Si+1 has been described in FIG. 3, the present disclosure is not limited thereto. In some embodiments, the ith scan line Si, the (i−1)th scan line Si−1, and the (i+1)th scan line Si+1 may be separate signal lines respectively supplied with scan signals from different scan drivers.

FIG. 4 is a sectional view illustrating a pixel included in the tiled display device in accordance with some embodiments of the present disclosure.

Referring to FIG. 4, the pixel PXL may include a base layer BSL, a pixel circuit part PCL, and a display element part DPL. In FIG. 4, for convenience of description, the pixel PXL will be described based on a configuration of a transistor corresponding to the sixth transistor T6 among the first to seventh transistors T1 to T7 shown in FIG. 3.

The base layer BSL may be a rigid or flexible substrate. In some embodiments, the base layer BSL may include a rigid material or a flexible material. In some embodiments, the flexible material may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material of the base layer BSL, which is applied to some embodiments of the present disclosure, is not limited to any specific example.

The pixel circuit part PCL may include a buffer layer BFL, a sixth transistor T6, a gate insulating layer GI, a first interlayer insulating layer ILD1, a second interlayer insulating layer ILD2, a bridge pattern BRP, a power line PLE, a first contact part CNT1, a second contact part CNT2, and a protective layer PSV.

The buffer layer BFL may be located on the base layer BSL. The buffer layer BFL may reduce or prevent impurities being diffused from the outside. The buffer layer BFL may include at least one of silicon nitride (SiNx), silicon oxide (SiOx), silicon oxynitride (SiOxNy), and metal oxide such as aluminum oxide (AlOx).

The sixth transistor T6 may be a thin film transistor. In some embodiments, the sixth transistor T6 may be a driving transistor. The sixth transistor T6 may include a semiconductor layer SCL, a gate electrode GE, a source electrode SE, and a drain electrode DE.

The semiconductor layer SCL may be located on the buffer layer BFL. The semiconductor layer SCL may include at least one of poly-silicon, amorphous silicon, and an oxide semiconductor.

The semiconductor layer SCL may include a first contact region in contact with the source electrode SE, and a second contact region in contact with the drain electrode DE.

The first contact region and the second contact region may correspond to a semiconductor pattern doped with an impurity. A region between the first contact region and the second contact region may be a channel region. The channel region may correspond to an intrinsic semiconductor pattern undoped with the impurity.

The gate insulating layer GI may be provided over the semiconductor layer SCL. The gate insulating layer GI may include an inorganic material. In some embodiments, the gate insulating layer GI may include at least one of silicon nitride (SiNx), silicon oxide (SiOx), silicon oxynitride (Si- OxNy), and aluminum oxide (AlOx). In some embodiments, the gate insulating layer GI may include an organic material.

The gate electrode GE may be located on the gate insulating layer GI. A position of the gate electrode GE may correspond to that of the channel region of the semiconductor layer SCL. For example, the gate electrode GE may be located on the channel region of the semiconductor layer SCL with the gate insulating layer GI interposed therebetween.

The first interlayer insulating layer ILD1 may be located over the gate electrode GE. Like the gate insulating layer GI, the first interlayer insulating layer ILD1 may include at least one of silicon nitride (SiNx), silicon oxide (SiOx), silicon oxynitride (SiOxNy), and aluminum oxide (AlOx).

The source electrode SE and the drain electrode DE may be located on the first interlayer insulating layer ILD1. The source electrode SE may penetrate the gate insulating layer GI and the first interlayer insulating layer ILD1, and may be in contact with the first contact region of the semiconductor layer SCL. The drain electrode DE may penetrate the gate insulating layer GI and the first interlayer insulating layer ILD1, and may be in contact with the second contact region of the semiconductor layer SCL.

The second interlayer insulating layer ILD2 may be located over the source electrode SE and the drain electrode DE. Like the first interlayer insulating layer ILD1 and the gate insulating layer GI, the second interlayer insulating layer ILD2 may include an inorganic material. The inorganic material may include at least one of the materials exemplified as the material constituting the first interlayer insulating layer ILD1 and the gate insulating layer GI, e.g., silicon nitride (SiNx), silicon oxide (SiOx), silicon oxynitride (SiOxNy), and aluminum oxide (AlOx). In some embodiments, the second interlayer insulating layer ILD2 may include an organic material.

The bridge pattern BRP may be located on the second interlayer insulating layer ILD2. The bridge pattern BRP may be electrically connected to the drain electrode DE through a contact hole penetrating the second interlayer insulating layer ILD2.

The power line PLE may be located on the second interlayer insulating layer ILD2. The power line PLE may be supplied with power from the second power line ELVSS described with reference to FIG. 3.

The protective layer PSV may be located on the second interlayer insulating layer ILD2. The protective layer PSV may cover the bridge pattern BRP and the power line PLE.

The protective layer PSV may be provided in a form including an organic insulating layer, an inorganic insulating layer, or the organic insulating layer located on the inorganic insulating layer.

The protective layer PSV may include the first contact part CNT1 electrically connected to one region of the bridge pattern BRP, and the second contact part CNT2 electrically connected to one region of the power line PLE.

The display element part DPL may include a bank pattern BNP, a first electrode EL1, a second electrode EL2, a first insulating layer INS1, a light emitting element LD, a first contact electrode CNE1, a second contact electrode CNE2, a second insulating layer INS2, a bank BNK, and a third insulating layer INS3.

The bank pattern BNP may have a shape protruding in an upper direction, and the first electrode EL1 and the second electrode EL2 are arranged over the bank pattern BNP, so that a reflective partition wall can be formed. The reflective partition wall is formed so that the light emission efficiency of the light emitting element LD can be improved.

The first electrode EL1 may be arranged on the protective layer PSV. The first electrode EL1 may be a path through which a voltage of the first power source ELVDD described with reference to FIG. 3 can be applied. Also, the first electrode EL1 may be a path through which electrical information for driving the light emitting element LD can be provided.

The second electrode EL2 may be arranged on the protective layer PSV. The second electrode EL2 may be a path through which a voltage of the second power source ELVSS described with reference to FIG. 3 can be applied.

The first electrode EL1 and the second electrode EL2 may reflect light emitted from the light emitting element LD in a display direction such that the light emission efficiency of the light emitting element LD is improved. The display direction may be, at least generally, the third direction DR3.

The first insulating layer INS1 may be located on the protective layer PSV. Like the second interlayer insulating layer ILD2, the first insulating layer INS1 may include at least one of silicon nitride (SiNx), silicon oxide (SiOx), silicon oxynitride (SiOxNy), and aluminum oxide (AlOx).

At least a portion of the first insulating layer INS1 may be located the first electrode EL1, and/or the second electrode EL2, to thereby stabilize electrical connection and reduce external influence.

The light emitting element LD may be located on the first insulating layer INS1. In some embodiments, the first insulating layer INS1 may have a groove (e.g., a predetermined groove). At least a portion of the light emitting element LD may be in contact with an end portion formed by the groove, and another portion of the light emitting element LD may be in contact with another end portion formed due to the groove.

The light emitting element LD may be located on the first insulating layer INS1 between the first electrode EL1 and the second electrode EL2. The light emitting element LD may be an element including an inorganic material having a nano scale or micro scale.

The light emitting element LD may include a first semiconductor layer, a second semiconductor layer, an active layer, and an insulating layer. The first semiconductor layer may include a semiconductor layer (e.g., a semiconductor layer having a predetermined type), and the second semiconductor layer may include a semiconductor layer having a type that is different from that of the first semiconductor layer. In some embodiments, the first semiconductor layer may include an N-type semiconductor layer, and the second semiconductor layer may include a P-type semiconductor layer.

The first semiconductor layer and the second semiconductor layer may include any one semiconductor material among InAlGaN, GaN, AlGaN, InGaN, AlN, and InN.

The active layer may be located between the first semiconductor layer and the second semiconductor layer. The active layer may have a single quantum well structure or a multiple quantum well structure.

When an electric field (e.g., an electric having a predetermined voltage or higher) is applied to both ends of the light emitting element LD, electron-hole pairs may be combined in the active layer, and light may be emitted from the light emitting element LD.

The second insulating layer INS2 may be located on the light emitting element LD. The second insulating layer INS2 may be formed to cover a region corresponding to the active layer of the light emitting element LD. The second insulating layer INS2 may include at least one of an organic material and an inorganic material.

In some embodiments, at least a portion of the second insulating layer INS2 may be located on a rear surface of the light emitting element LD. The second insulating layer INS2 formed on the rear surface of the light emitting element LD may fill an empty gap(s) between the first insulating layer INS1 and the light emitting element LD in a process of forming the second insulating layer INS2 on the light emitting element LD.

The first contact electrode CNE1 and the second contact electrode CNE2 may be located on the first insulating layer INS1. The first contact electrode CNE1 and the second contact electrode CNE2 may be electrically connected respectively to the first electrode EL1 and the second electrode EL2 through contact holes formed in the first insulating layer INS1.

The first contact electrode CNE1 and the second contact electrode CNE2 may include at least one of conductive materials including Indium Tin Oxide (ITO), Indium Zinc Oxide (IZO), and Indium Tin Zinc Oxide (ITZO).

An electrical signal provided through the first electrode EL1 may be provided to the light emitting element LD through the first contact electrode CNE1, and the light emitting element LD may emit light based on the electrical signal provided through the first electrode EL1.

An electrical signal provided through the second electrode EL2 may be provided to the light emitting element LD through the second contact electrode CNE2.

The bank BNK may be a structure for defining an emission area (e.g., the emission area EMA shown in FIG. 5) of the pixel PXL. The emission area EMA may mean an area in which light is emitted from the light emitting element LD. For example, the bank BNK may be located in a boundary area between adjacent light emitting elements LD to surround the light emitting element LD of the pixel PXL.

The third insulating layer INS3 may be located over the bank BNK, the first contact electrode CNE1, the second contact electrode CNE2, and the second insulating layer INS2. The third insulating layer INS3 may include any one of an organic material and an inorganic material. The third insulating layer INS3 may protect the display element part DPL from external influence.

An arrangement relationship of the light emitting element LD, the electrodes, and the like is not limited to the embodiments described with reference to FIG. 4, and arrangement relationships in accordance with various modifiable embodiments may be implemented.

Hereinafter, a light control part LCP included in the display panel DP will be described. For convenience of description, detailed structures and overlapping descriptions of the pixel circuit part PCL and the display element part DPL will be omitted, and a partial structure of the display panel DP including the light control part LCP will be described in detail.

Figure 5:
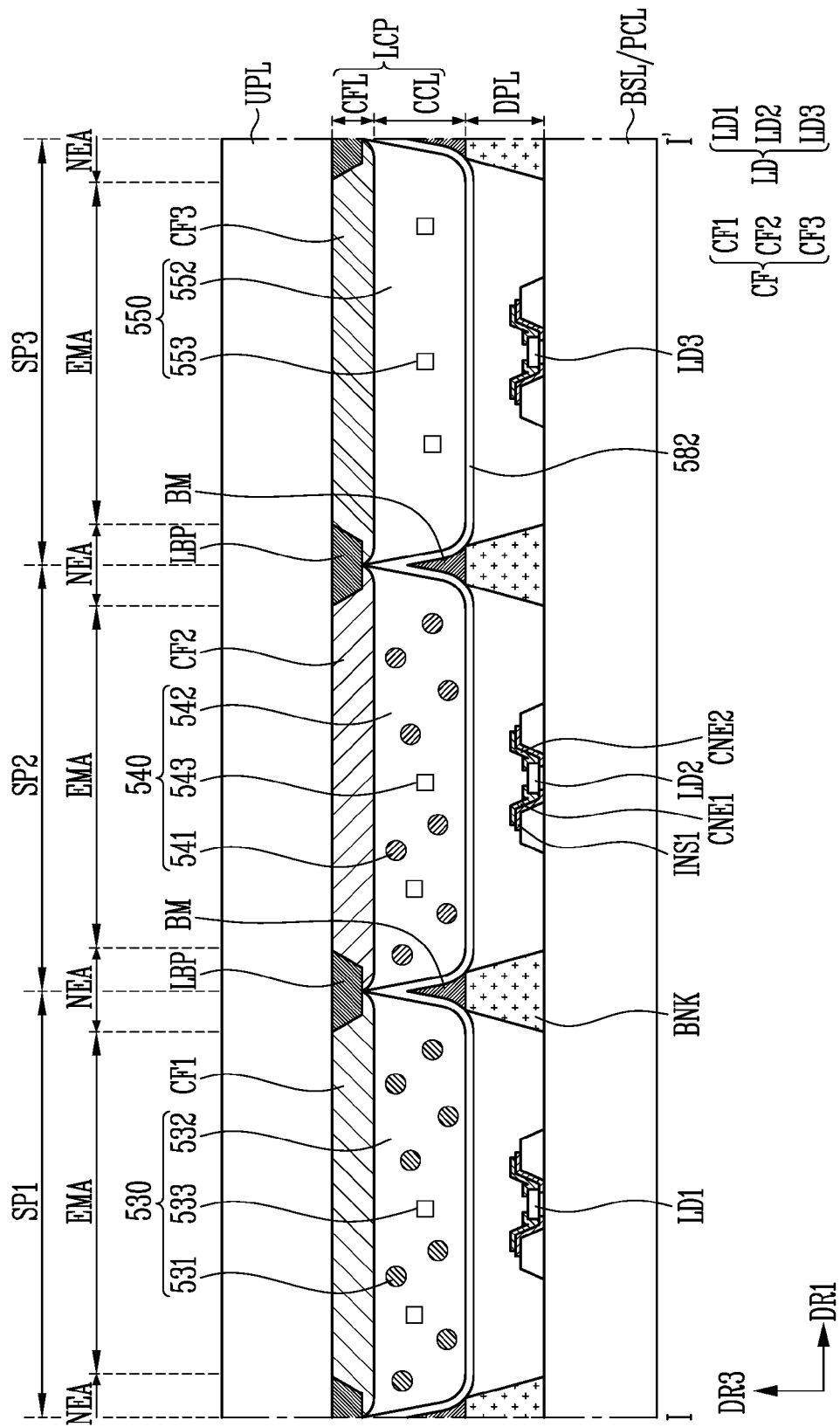
FIGS. 5 and 6 are sectional views taken along the line I-I' shown in FIG. 1.
Figure 6:
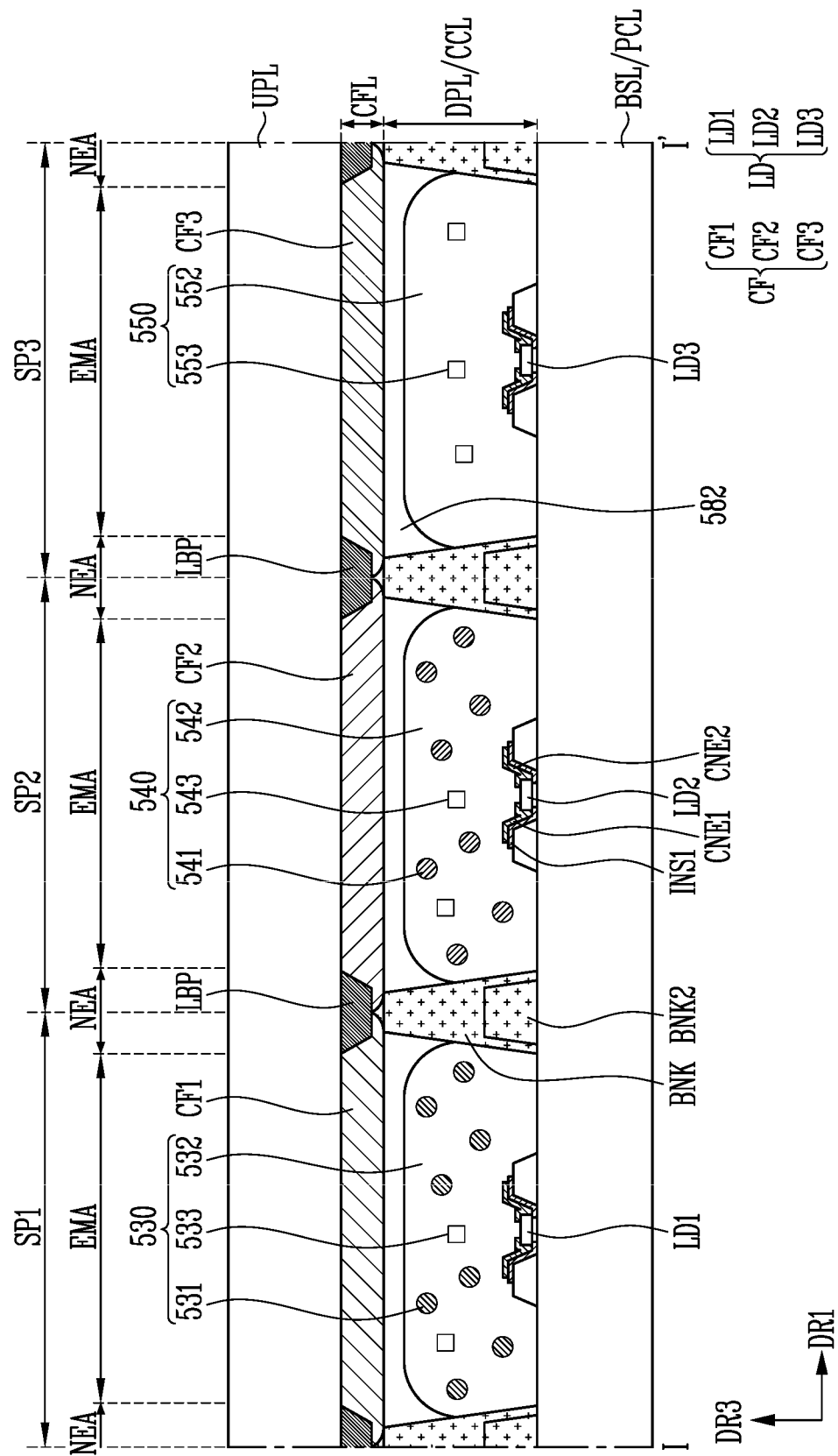

FIGS. 5 and 6 are sectional views taken along the line I-I' shown in FIG. 1.

The pixel PXL may include a light control part LCP and an upper substrate UPL. The light control part LCP may include a color conversion part CCL and a color filter part CFL.

The light emitting element LD may include a first light emitting element LD1, a second light emitting element LD2, and a third light emitting element LD3. The first light emitting element LD1 may be included in the first sub-pixel SP1. The second light emitting element LD2 may be included in the second sub-pixel SP2. The third light emitting element LD3 may be included in the third sub-pixel SP3.

The color conversion part CCL may include a black matrix BM, a plurality of wavelength conversion patterns 530 and 540, and a first light transmission pattern 550. The plurality of wavelength conversion patterns 530 and 540 may include a first wavelength conversion pattern 530 and a second wavelength conversion pattern 540.

The black matrix BM may be located between the color filter part CFL and the display element part DPL in a non-emission area NEA. The black matrix BM may define the emission area EMA and the non-emission area NEA.

The emission area EMA may mean an area in which, or through which, light is emitted, and the non-emission area NEA may mean an area in which no light is emitted. For example, an area in which the black matrix BM is located may correspond to the non-emission area NEA in which no light is emitted. The black matrix BM may include a light blocking material and/or a reflective material.

The first wavelength conversion pattern 530 may be located in the non-emission area of the first sub-pixel SP1 in a plane view.

The first wavelength conversion pattern 530 may include a first wavelength conversion material 531, a first base resin 532, and a first scattering material 533.

The first wavelength conversion material 531 may convert a peak wavelength of incident light. In some embodiments, the first wavelength conversion material 531 may convert blue light into red light having a wavelength of about 610 nm to about 650 nm.

The first wavelength conversion material 531 may be a quantum dot (QD), a quantum rod, or a fluorescent substance.

The quantum dot may mean a particle material that emits light (e.g., light having a specific wavelength) when electrons are transferred from a conduction band to a valence band. The quantum dots may be semiconductor nanocrystalline materials. The quantum dots have a band gap (e.g., a specific band gap) depending on their composition and size, and may emit light having a band (e.g., a corresponding inherent band) after absorbing light. Examples of the semiconductor nanocrystals of the quantum dots may include a Group IV based nanocrystal, a Group II-VI based compound nanocrystal, a Group III-V based compound nanocrystal, a Group IV-VI based nanocrystal, or a combination thereof.

The first base resin 532 may have high light transmittance, and may have excellent dispersion characteristic with respect to the first wavelength conversion material 531. For example, the first base resin 532 may include an organic material such as epoxy-based resin, acryl-based resin, cardo-based resin, or imide-based resin.

The first scattering material 533 may have a refractive index that is different from that of the first base resin 532, and may form an optical interface with the first base resin 532. The first scattering material 533 may be a light scattering particle. In some embodiments, the first scattering material 533 may be a metal oxide particle or an organic particle.

The second wavelength conversion pattern 540 may be located in the emission area EMA of the second sub-pixel SP2 in a plane view. The second wavelength conversion pattern 540 may include a second wavelength conversion material 541, a second base resin 542, and a second scattering material 543.

The second wavelength conversion material 541 may convert a peak wavelength of incident light. In some embodiments, the second wavelength conversion material 541 may convert blue light into green light having a wavelength of about 510 nm to about 550 nm.

The second wavelength conversion material 541 may be a quantum dot (QD), a quantum rod, or a fluorescent substance.

The second base resin 542 may have high light transmittance and excellent dispersion characteristic with respect to the second wavelength conversion material 541. For example, like the first base resin 532, the second base resin 542 may include an organic material such as epoxy-based resin, acryl-based resin, cardo-based resin, or imide-based resin.

The second scattering material 543 may have a refractive index that is different from that of the second base resin 542, and may form an optical interface with the second base resin 542. The second scattering material 543 may be a light scattering particle.

The first light transmission pattern 550 may be located in the emission area EMA of the third sub-pixel SP3 in a plane view. The first light transmission pattern 550 may include a third base resin 552 and a third scattering material 553.

The third base resin 552 may have high light transmittance and excellent dispersion characteristic with respect to the third scattering material 553. For example, like the first base resin 532, the third base resin 552 may include an organic material such as epoxy-based resin, acryl-based resin, cardo-based resin, or imide-based resin.

The third scattering material 553 may have a refractive index that is different from that of the third base resin 552, and may form an optical interface with the third base resin 552. The third scattering material 553 may be a light scattering particle.

A capping layer 582 along with a color filter CF may seal the first wavelength conversion pattern 530, the second wavelength conversion pattern 540, and the first light transmission pattern 550, and accordingly, can reduce or prevent the likelihood of damage to, or contamination of, the first wavelength conversion pattern 530, the second wavelength conversion pattern 540, and the first light transmission pattern 550 due to penetration of a foreign matter, such as moisture or air, from the outside. The capping layer 582 may include at least one of an inorganic material and an organic material.

In some embodiments, the color conversion part CCL might not be separated from the display element part DPL by the capping layer 582. Referring to FIG. 6, the first wavelength conversion pattern 530, the second wavelength conversion pattern 540, and the first light transmission pattern 550 may be covered by the light emitting element LD, an electrode configuration of the light emitting element LD, and the capping layer 582.

In accordance with some embodiments, as shown in FIG. 6, a second bank BNK2 is included to define positions of the first wavelength conversion pattern 530, the second wavelength conversion pattern 540, and the first light transmission pattern 550. Like the black matrix BM, the second bank BNK2 may include a light blocking material or a reflective material.

The color filter part CFL may include a light blocking pattern LBP and a plurality of color filters CF. The plurality of color filters may include a first color filter CF1, a second color filter CF2, and a third color filter CF3.

The light blocking pattern LBP may be located in the non-emission area NEA. The light blocking pattern LBP may be located along a boundary of the emission area EMA, and may block light transmission. The light blocking pattern LBP may include light blocking material. In some embodiments, the light blocking pattern LBP may be made of the same material as the black matrix BM, but the present disclosure is not limited thereto.

Any one of the plurality of color filters CF allows light having a specific wavelength to be selectively transmitted therethrough, and may absorb light having a wavelength that is different from the specific wavelength. Light passing through the color filter CF may display one of three primary colors of red, green, and blue. However, a display color of light passing through the color filter CF is not limited to the primary colors, and the light passing through the color filter CF may display any one of cyan, magenta, yellow, and a white-based color.

The first color filter CF1 may be located in the emission area EMA of the first sub-pixel SP1. The first color filter CF1 allows light of a first color to be transmitted therethrough, and may absorb light of a second color and light of a third color. The first color filter CF1 may include a colorant of the first color.

The second color filter CF2 may be located in the emission area EMA of the second sub-pixel SP2. The second color filter CF2 allows light of the second color to be transmitted therethrough, and may absorb light of the first color and light of the third color. The second color filter CF2 may include a colorant of the second color.

The third color filter CF3 may be located in the emission area EMA of the third sub-pixel SP3. The third color filter CF3 allows light of the third color to be transmitted therethrough, and may absorb light of the first color and light of the second color. The third color filter CF3 may include a colorant of the third color.

The upper substrate UPL may be located on the light control part LCP. The upper substrate UPL may include a material having a light transmissivity. The upper substrate UPL may be a rigid substrate or a flexible substrate. In some embodiments, the upper substrate UPL may be a window member or an encapsulation substrate. In some embodiments, the upper substrate UPL may be omitted from the display device DD.

Hereinafter, the bonding area BA in which the plurality of devices DD provided in the tiled display device TDD are connected to each other will be described in detail.

Figure 7:
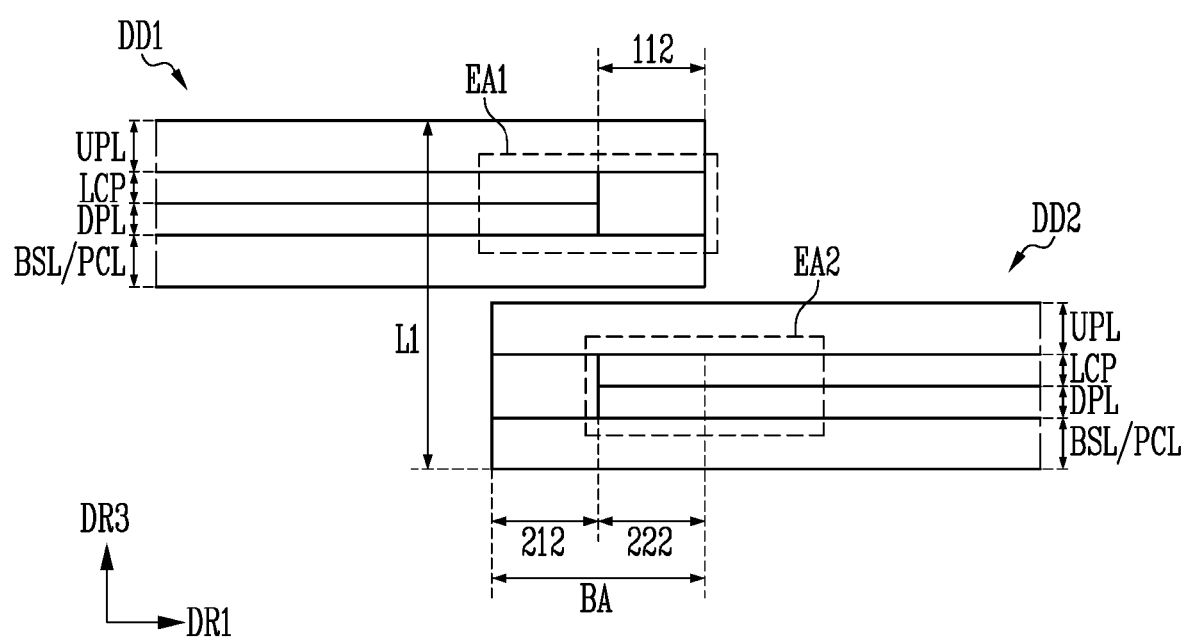
FIG. 7 is a sectional view illustrating a bonding area of the tiled display device in accordance with some embodiments of the present disclosure.

FIG. 7 is a sectional view illustrating a bonding area of the tiled display device in accordance with some embodiments of the present disclosure.

As described with reference to FIG. 1, the tiled display device TDD is provided in a form in which a plurality of display devices DD are bonded to each other. For example, at least a portion of the bonding area BA may be an area in which the first display device DD1 and the second display device DD2 are connected to each other. Another portion of the bonding area BA may be an area in which the first display device DD1 and the third display device DD3 are connected to each other. Still another portion of the bonding area BA may be an area in which the second display device DD2 and the fourth display device DD4 are connected to each other. Still another portion of the bending area BA may be an area in which the third display device DD3 and the fourth display device DD4 are connected to each other. Hereinafter, for convenience of description, the area in which the first display device DD1 and the second display device DD2 in the bonding area BA are connected to each other will be mainly described.

Referring to FIG. 7, the first display device DD1 and the second display device DD2 may be connected to each other in the bonding area BA. In some embodiments an adhesive layer may be provided between the first display device DD1 and the second display device DD2 such that the first display device DD1 and the second display device DD2 are bonded to each other. The adhesive layer may include a resin, an optically clear adhesive, and a pressure sensitive adhesive. However, the present disclosure is not limited thereto, and the adhesive layer may include various adhesive materials known in the art, which can connect different layers to each other.

The first display device DD1 and the second display device DD2 may be located at different heights with respect to the third direction DR3.

At least a portion of the first display device DD1 and at least a portion of the second display device DD2 may overlap with each other. The first display device DD1 and the second display device DD2 may overlap with each other in the bonding area BA in a plane view.

The first display device DD1 may include a first outer area 112. The first outer area 112 may be located in the bonding area BA. The first outer area 112 may overlap with the bonding area BA for the first display device DD1 and the second display device DD2 in a plane view.

Lines of the first display device DD1 may be located in the first outer area 112. Therefore, the pixel PXL of the first display device DD1 may be omitted from the first outer area 112. Accordingly, the light emitting element LD and an electrode configuration thereof may be excluded from the first outer area 112.

Figure 8:
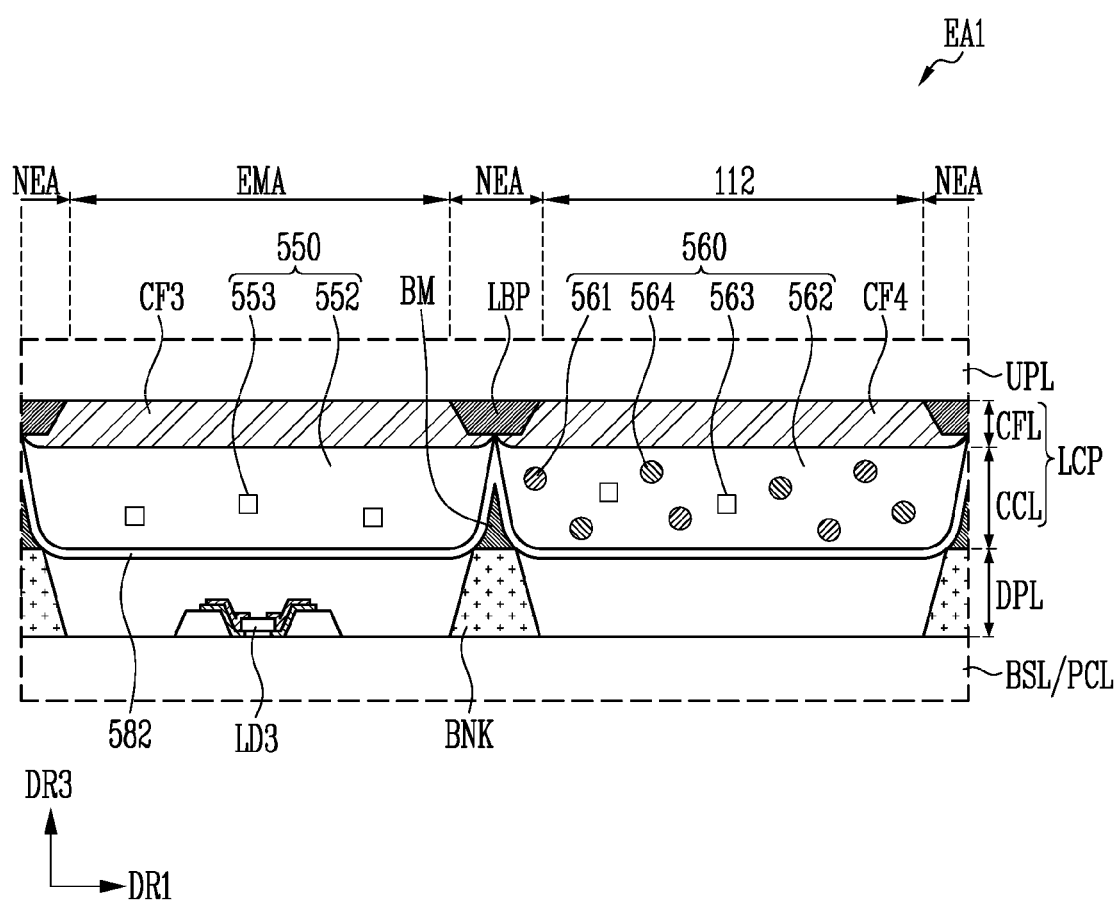
FIG. 8 is an enlarged view of area EA1 shown in FIG. 7.

However, in some embodiments, the light control part LCP may be included in the first outer area 112, as shown in FIG. 8. FIG. 8 is an enlarged view of area EA1 shown in FIG. 7.

In accordance with some embodiments, the light control part LCP provided in the first outer area 112 may include a color conversion part CCL including a third wavelength conversion pattern 560 and the color filter part CFL including a fourth color filter CF4.

The third wavelength conversion pattern 560 may include a third wavelength conversion material 561, a fourth wavelength conversion material 564, a fourth base resin 562, and a fourth scattering material 563.

The third wavelength conversion material 561 may convert a peak wavelength of incident light. In some embodiments, the third wavelength conversion material 561 may convert blue light into red light having a wavelength of about 610 nm to about 650 nm. That is, the third wavelength conversion material 561 may be substantially identical to the first wavelength conversion material 531. The third wavelength conversion material 561 may be a quantum dot (QD), a quantum rod, or a fluorescent substance.

The fourth wavelength conversion material 564 may convert a peak wavelength of incident light. In some embodiments, the fourth wavelength conversion material 564 may convert blue light into green light having a wavelength of about 510 nm to about 550 nm. That is, the fourth wavelength conversion material 564 may be substantially identical to the second wavelength conversion material 541. The fourth wavelength conversion material 564 may be a quantum dot (QD), a quantum rod, or a fluorescent substance.

The fourth base resin 562 may have high light transmittance, and may have excellent dispersion characteristic with respect to the fourth scattering material 563. In some embodiments, like the third base resin 552, the fourth base resin 562 may include an organic material such as epoxy-based resin, acryl-based resin, cardo-based resin, or imide-based resin.

The fourth scattering material 563 may have a refractive index that is different from that of the fourth base resin 562, and may form an optical interface with the fourth base resin 562. In some embodiments, the fourth scattering material 563 may be a light scattering particle.

Light transmitted through the third wavelength conversion pattern 560 may be white light. For example, when blue light is provided to the color conversion part CCL including the third wavelength conversion pattern 560, at least a portion of the provided blue light may be converted into red light by the third wavelength conversion material 561, and another portion of the provided blue light may be converted into green light by the fourth wavelength conversion material 564. That is, the light transmitted through the third wavelength conversion pattern 560 may represent white light, including blue light, green light, and red light.

The fourth color filter CF4 may be located in the first outer area 112. The fourth color filter CF4 may allow light of a fourth color to be transmitted therethrough. The fourth color may correspond to a white color.

Referring back to FIG. 7, the second display device DD2 may include a second outer area 212. The second outer area 212 may be located in the bonding area BA. The second outer area 212 may overlap with the bonding area BA for the first display device DD1 and the second display device DD2 in a plane view. The second outer area 212 might not overlap with the first outer area 112 in a plane view.

Lines of the second display device DD2 may be located in the second outer area 212. Therefore, like the first display device DD1, the pixel PXL of the second display device DD2 may be omitted from the second outer area 212.

The display element part DPL including the light emitting element LD and the light control part LCP may be omitted from the second outer area 212. Light might not be output in the second outer area 212 of the second display device DD2.

As described above, the tiled display device TDD is implemented by bonding a plurality of display device DD, and therefore, the light emitting element LD and an electrode configuration thereof may be omitted from at least a portion of an area in which the plurality of display devices DD are connected to each other. However, in accordance with some embodiments, the tiled display device TDD may further include a dummy pixel area 222 so that light can be displayed even in the bonding area BA for the plurality of display devices DD.

Figure 9:
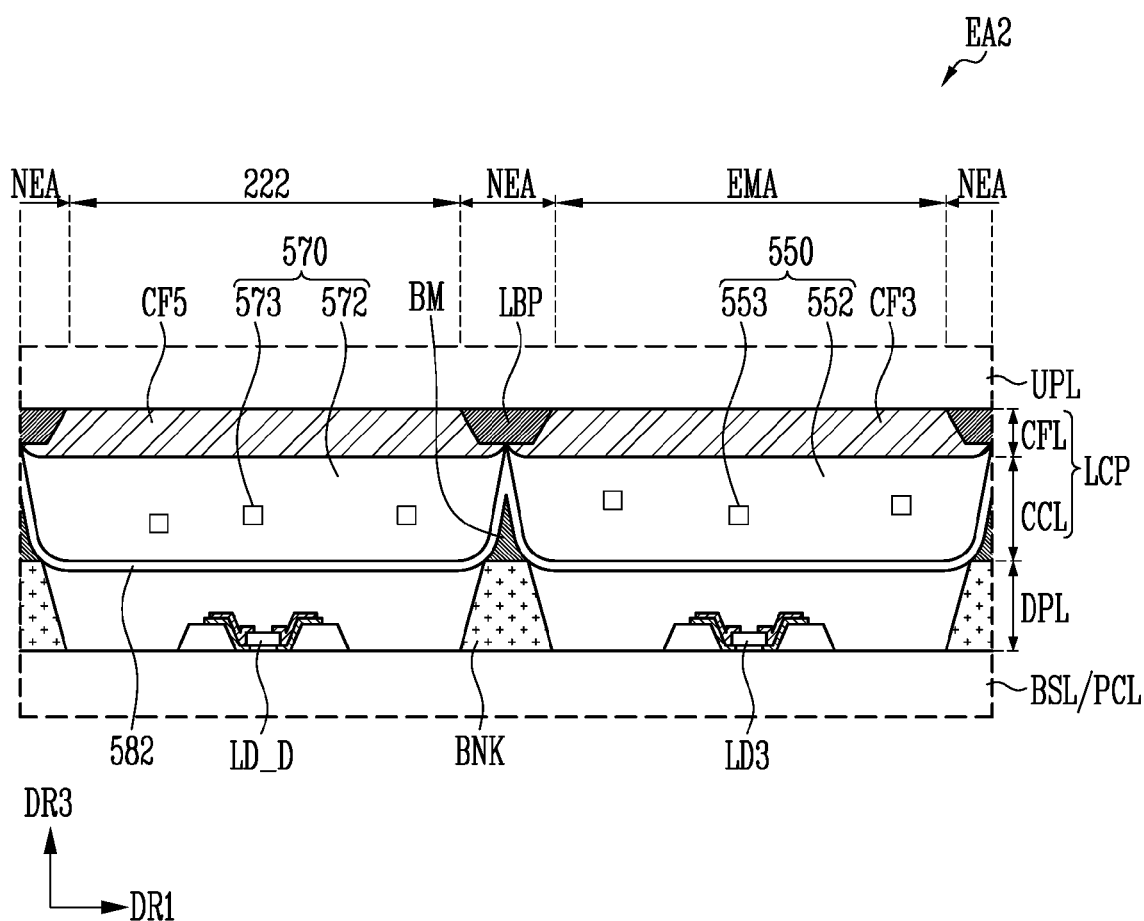
FIG. 9 is an enlarged view of area EA2 shown in FIG. 7.

Referring to FIGS. 7 to 9, the second display device DD2 may include the dummy pixel area 22. FIG. 9 is an enlarged view of area EA2 shown in FIG. 7.

The dummy pixel area 222 may be provided at at least a portion of a display device located in a lower direction among adjacent display devices DD overlapping with each other in the bonding area BA. The lower direction may be the opposite direction of the display direction of the tiled display device TDD.

The position of the dummy pixel area 222 may be adjacent to the second outer area 212. The dummy pixel area 222 may mean an area provided with the pixel PXL most adjacent to the second outer area 212.

Light may be provided in the dummy pixel area 222. Referring to FIG. 9, a dummy light emitting element LD_D may be included in the dummy pixel area 222, so that light is emitted along the third direction DR3.

A luminance of light provided in the dummy pixel area 222 and a luminance of the pixel PXL arranged at a position adjacent to the dummy pixel area 222 may have a difference (e.g., a predetermined difference) or less. The luminance of light provided in the dummy pixel area 222 may correspond to that of the pixel PXL arranged at the position adjacent to the dummy pixel area 222. A luminance of light emitted from the dummy light emitting element LD_D may be equal to that of the pixel PXL arranged at a position most adjacent to the dummy light emitting element LD_D. That is, the intensity of light of the dummy pixel area 222 may have a first intensity, and the intensity of light of the pixel PXL arranged at the position adjacent to the dummy pixel area 222 may have a second intensity. The first intensity and the second intensity may be substantially the same.

For example, referring to FIG. 9, a luminance of light emitted from the dummy light emitting element LD_D arranged in the dummy pixel area 222 may be substantially equal to that of light emitted from the light emitting element LD3 arranged in an adjacent emission area EMA partitioned by the bank BNK. However, in some embodiments, the luminance of the dummy light emitting element LD_D may be greater than that of the light emitting element LD3 arranged in the adjacent emission area EMA. When light emitted from the dummy pixel area 222 is transmitted through an additional component and then emitted to the outside, the intensity of light, which may be decreased, can be compensated.

The dummy pixel area 222 may include the color conversion part CCL including a second light transmission pattern 570 and the color filter part CFL including a fifth color filter CF5.

The second light transmission pattern 570 may be located in the dummy pixel area 222 in a plane view. The second light transmission pattern 570 may include a fifth base resin 572 and a fifth scattering material 573.

The fifth base resin 572 may have high light transmittance and excellent dispersion characteristic with respect to the fifth scattering material 573. The fifth base resin 572 may include any one of the materials described with reference to the fourth base resin 562.

The fifth scattering material 573 may have a refractive index that is different from that of the fifth base resin 572, and may form an optical interface with the fifth base resin 572. In some embodiments, the fifth scattering material 573 may be a light scattering particle.

The second light transmission pattern 570 may be substantially identical to the first light transmission pattern 550 described with reference to FIG. 5. However, the present disclosure is not limited thereto. In some embodiments, the color conversion part CCL for the dummy pixel area 222 may further include at least one of the first and second wavelength conversion patterns 530 and 540.

The fifth color filter CF5 may be located in the dummy pixel area 222. The fifth color filter CF5 may allow light of a fifth color to be transmitted therethrough. The fifth color may be blue. The fifth color filter CF5 may be substantially identical to the third color filter CF3. That is, the fifth color may be equal to the third color. Accordingly, light emitted from the dummy pixel area 222 may be light of the fifth color. In some embodiments, the light output from the dummy pixel area 222 may be blue light.

Referring back to FIG. 7, the light emitted from the dummy pixel area 222 may be provided to the first outer area 112 of the first display device DD1 along the third direction DR3. That is, light may be emitted in the first outer area 112 despite being without arrangement of the light emitting element LD of the first display device DD1.

The light output from the dummy pixel area 222 may be transmitted through the light control part LCP of the first outer area 112 and then provided to the outside.

The wavelength of at least a portion of the light output from the dummy pixel area 222 may be converted by the third wavelength conversion pattern 560 provided in the light control part LCP of the first outer area 112, so that the light having the converted wavelength is output.

For example, when blue light is provided from the dummy pixel area 222, the provided blue light may be converted into white light by the third wavelength conversion pattern 560 of the first outer area 112, so that the white light is acquired.

As described above, a space in which the light emitting element LD may be located might not be sufficiently secured in an area in which the plurality of display devices DD constituting the tiled display device TDD are adjacent to each other. However, in the tiled display device TDD in accordance with some embodiments of the present disclosure, at least portions of adjacent display devices DD overlap with each other, and light is output from a display device arranged in the lower direction (the second display device DD2 with respect to FIG. 7) in the bonding area BA. Accordingly, light can be provided even in the bonding area BA of the tiled display device TDD.

Hereinafter, a modified structure of the tiled display device TDD will be described with reference to FIGS. 10 and 11.

Figure 10:
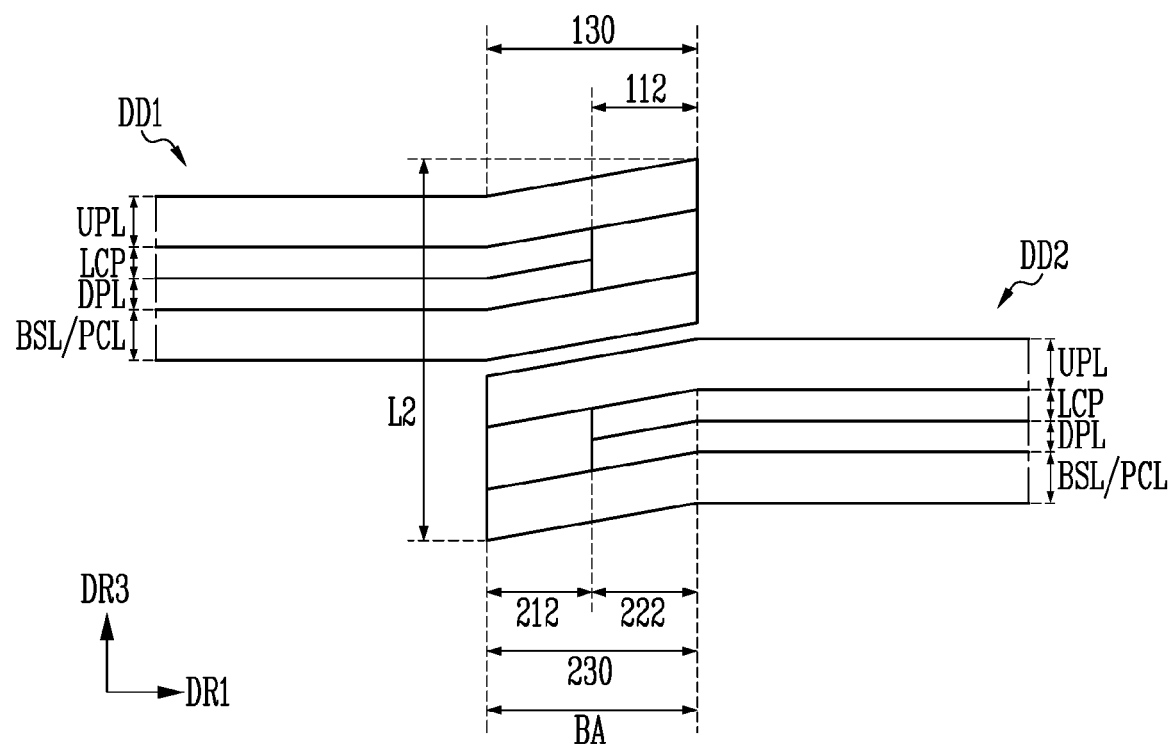
FIGS. 10 and 11 are sectional views illustrating a bonding area of the tiled display device in accordance with other embodiments of the present disclosure.
Figure 11:
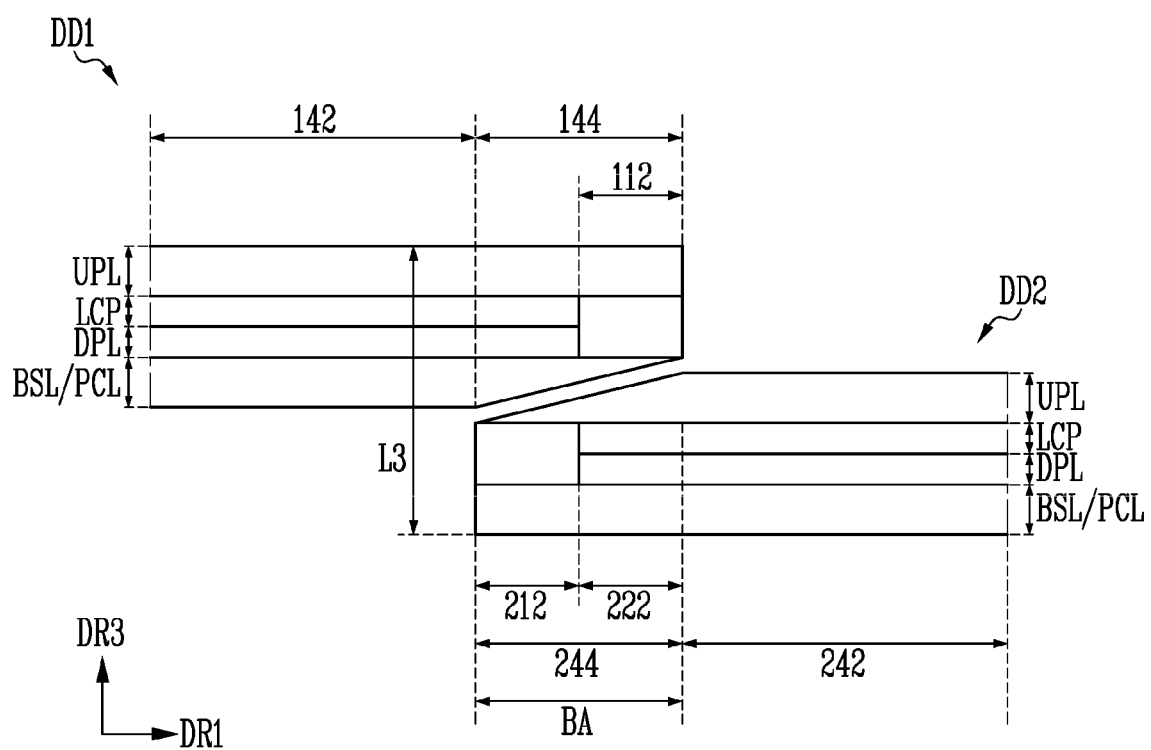

FIGS. 10 and 11 are sectional views illustrating a bonding area of the tiled display device in accordance with other embodiments of the present disclosure.

Referring to FIG. 10, at least a portion of the display device DD1 may be bent. In addition, at least a portion of the second display device DD2 may be bent.

In the tiled display device TDD in accordance with some embodiments of the present disclosure, because at least portions of the plurality of display devices DD overlap with each other, a thickness of the bonding area BA may be thicker than that of an area outside of the bonding area BA. That is, referring to FIG. 7, the thickness of the tiled display device TDD in the bonding area BA in accordance with some embodiments of the present disclosure may have a first thickness L1.

Referring to FIG. 10, at least a portion of each of the first display device DD1 and the second display device DD2 may be bent, and the bent portions may overlap with each other in the bonding area BA. For example, the first display device DD1 may have a first bending area 130 in which at least a portion of the first display device DD1 is bent, and the second display device DD2 may have a second bending area 230 in which at least a portion of the second display device DD2 is bent. The first bending area 130 and the second bending area 230 may overlap with each other in the bonding area BA.

Consequently, in accordance with the embodiments described with reference to FIG. 10, the thickness of the tiled display device TDD in the bonding area BA may have a second thickness L2 that is smaller than the first thickness L1 shown in FIG. 7.

Referring to FIG. 11, the thickness of at least a portion of the first display device DD1, which is located in the bonding area BA, may be thin (e.g., thinner than a portion of the first display device DD1 outside of the bonding area BA). Similarly, the thickness of at least a portion of the second display device DD2, which is located in the bonding area BA, may be thin.

For example, a thickness of the base layer BSL and/or the pixel circuit part PCL of the first display device DD1 in the bonding area BA may be thinner than that of the base layer BSL and/or the pixel circuit part PCL of the first display device DD1 in an area outside of the bonding area BA. Similarly, a thickness of the base layer BSL and/or the pixel circuit part PCL of the second display device DD2 in the bonding area BA may be thinner than that of the base layer BSL and/or the pixel circuit part PCL of the second display device DD2 in an area outside the bonding area BA.

For example, the first display device DD1 may include a first substrate, and the second display device DD2 may include a second substrate. The first substrate may include a (1-1)th substrate area 142 having a (1-1)th thickness, and a (1-2)th substrate area 144 having a (1-2)th thickness that is thinner than the (1-1)th thickness.

In addition, the second substrate may include a (2-1)th substrate area 242 having a (2-1)th thickness, and a (2-2)th substrate area 244 having a (2-2)th thickness that is thinner than the (2-1)th thickness. The (1-2)th substrate area 144 and the (2-2)th substrate area 244 overlap with each other in the bonding area BA in a plane view.

Consequently, in accordance with the embodiments described with reference to FIG. 11, because the thickness of at least a portion of each of the first display device DD1 and the second display device DD2 is decreased, the thickness of the tiled display device TDD in the bonding area BA may have a third thickness L3 that is smaller than the first thickness L1 of the embodiments corresponding to FIG. 7.

In accordance with the present disclosure, there can be provided a display device having reduced or minimized external visibility of portions thereof.

Embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with embodiments may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims, with functional equivalents thereof to be included therein.

What is claimed is:

1. A tiled display device comprising:
a first display device comprising a first pixel and a first light control part configured to convert a wavelength of provided light; and
a second display device coupled to the first display device in a bonding area, overlapping the first display device in the bonding area in a plane view such that at least a portion of the second display device is under a bottom of the first display device with respect to a thickness direction of the second display device, and comprising:
a second pixel;
a second outer area in the bonding area;
a dummy pixel area in which a light emitting element is located, the light emitting element being in the bonding area and being configured to output light; and
a second light control part configured to convert a wavelength of provided light, and having at least a portion that is in the dummy pixel area,
wherein the first display device comprises a first outer area in the bonding area with at least a portion of the first light control part therein,
wherein the first light control part in the first outer area comprises a first wavelength conversion material and a second wavelength conversion material,
wherein the first wavelength conversion material is configured to convert light of a first color into light of a second color, and
wherein the second wavelength conversion material is configured to convert the light of the first color into light of a third color.

2. The tiled display device of claim 1, wherein the first outer area and the second outer area do not overlap with each other in a plane view.

3. The tiled display device of claim 1, wherein the first outer area is configured to emit light therein without the first pixel being in the first outer area.

4. The tiled display device of claim 1, wherein the dummy pixel area overlaps with the first outer area in a plane view.

5. The tiled display device of claim 1, wherein at least a portion of the first pixel overlaps with the second outer area in a plane view, and
wherein the second outer area is configured to provide light therefrom.

6. The tiled display device of claim 1, wherein the first outer area is configured to transmit light output from a dummy pixel in the dummy pixel area such that light is externally emitted.

7. The tiled display device of claim 1, wherein the second light control part is not located in the second outer area.

8. The tiled display device of claim 1, wherein the first light control part in the first outer area is configured to convert light into white light.

9. The tiled display device of claim 1, wherein the second display device is configured to output blue light in the dummy pixel area.

10. The tiled display device of claim 1, wherein first light having a first wavelength is output from the dummy pixel area, and
wherein at least a portion of the first light is transmitted through the first outer area of the first display device such that the first light is converted into second light having a second wavelength that is different from the first wavelength.

11. The tiled display device of claim 1, wherein the second display device is configured to output the light of the first color in the dummy pixel area, and to output the light of the first color in a pixel area adjacent to the dummy pixel area.

12. The tiled display device of claim 11, wherein the second display device is configured to output light with a first luminance in the dummy pixel area, and to output light with a second luminance in a pixel area most adjacent to the dummy pixel area, the first luminance and the second luminance being substantially equal.

13. The tiled display device of claim 1, wherein the first display device comprises a first bending area in which at least a portion of the first display device is bent,
wherein the second display device comprises a second bending area in which at least a portion of the second display device is bent, and
wherein the first bending area and the second bending area overlap with each other in the bonding area.

14. The tiled display device of claim 1, wherein the first display device comprises a first substrate,
wherein the second display device comprises a second substrate,
wherein the first substrate comprises a (1-1)th substrate area having a (1-1)th thickness, and a (1-2)th substrate area having a (1-2)th thickness that is thinner than the (1-1)th thickness, wherein the second substrate comprises a (2-1)th substrate area having a (2-1)th thickness, and a (2-2)th substrate area having a (2-2)th thickness that is thinner than the (2-1)th thickness, and wherein the (1-2)th substrate area and the (2-2)th substrate area overlap with each other in the bonding area in a plane view.

\* \* \* \* \*